US012279380B2

(12) United States Patent
Del Rey et al.

(10) Patent No.: US 12,279,380 B2
(45) Date of Patent: Apr. 15, 2025

(54) METHOD FOR PRODUCING A CIRCUIT BOARD ARRANGEMENT (71) Applicant: Continental Automotive GmbH, Hannover (DE)

(72) Inventors: Rafael Del Rey, Frankfurt am Main (DE); Markus Bebendorf, Frankfurt am Main (DE)

(73) Assignee: CONTINENTAL AUTOMOTIVE GMBH, Hannover (DE)

(*) Notice: Subject to any disclaimer, the term of this patent is extended or adjusted under 35 U.S.C. 154(b) by 697 days.

(21) Appl. No.: 17/273,133

(22) PCT Filed: Sep. 10, 2019

(86) PCT No.: PCT/EP2019/074014
§ 371 (c)(1),
(2) Date: Mar. 3, 2021

(87) PCT Pub. No.: WO2020/053160
PCT Pub. Date: Mar. 19, 2020

(65) Prior Publication Data
US 2021/0329793 A1 Oct. 21, 2021

(30) Foreign Application Priority Data
Sep. 14, 2018 (DE) ...................... 10 2018 215 672.7

(51) Int. Cl.
H05K 3/36 (2006.01)
H05K 3/12 (2006.01)
H05K 3/34 (2006.01)

(52) U.S. Cl.
CPC ........... H05K 3/363 (2013.01); H05K 3/1216 (2013.01); H05K 3/3485 (2020.08);
(Continued)

(58) Field of Classification Search
CPC .... H05K 3/363; H05K 3/1216; H05K 3/3485; H05K 2201/09136; H05K 1/0271;
(Continued)

(56) References Cited

U.S. PATENT DOCUMENTS 3,373,481 A * 3/1968 Lins ........................ H01L 21/00
361/779
3,774,140 A 11/1973 Reimer
(Continued)

FOREIGN PATENT DOCUMENTS

CN 1642392 A 7/2005
CN 101752279 A 6/2010
(Continued)

OTHER PUBLICATIONS

German Search Report for German Application No. 10 2018 215 672.7, dated Apr. 26, 2021, with partial English translation, 10 pages.
(Continued)

Primary Examiner — Donghai D Nguyen
(74) Attorney, Agent, or Firm — Buchanan Ingersoll & Rooney PC (57) ABSTRACT A method for producing a circuit board arrangement includes: providing a first circuit board substrate, providing a second circuit board substrate, arranged substantially planar-parallel to the first circuit board substrate, the first circuit board substrate having an underside and the second circuit board substrate having an upper face, the upper face and the underside being arranged opposite one another, providing first terminal contacts, applied to the underside of the first circuit board substrate, providing second terminal contacts, applied to the upper face of the second circuit board substrate, applying solder paste cylinders to the first terminal contacts, the solder paste cylinders applied to the first
(Continued)

terminal contacts by a solder-paste application process with solder paste, the applied solder paste cylinders having in each case a solder-paste-cylinder upper face, and arranging the second terminal contacts of the second circuit board substrate on the solder-paste-cylinder upper faces of the solder paste cylinders.

8 Claims, 5 Drawing Sheets

(52) U.S. Cl.
CPC .............. *H05K 2201/09136* (2013.01); *H05K 2201/10628* (2013.01); *H05K 2201/10734* (2013.01)

(58) Field of Classification Search
CPC ........... H05K 3/1225; H05K 2201/068; H05K 2201/09736; H05K 2203/0415; Y10T 29/4913; Y10T 29/49144
See application file for complete search history.

(56) References Cited

U.S. PATENT DOCUMENTS

| | | | | |
|---|---|---|---|---|
| 5,804,248 | A * | 9/1998 | Hewett | H05K 3/1225 427/97.8 |
| 6,132,543 | A | 10/2000 | Mohri et al. | |
| 6,395,991 | B1 * | 5/2002 | Dockerty | H05K 3/3436 361/779 |
| 6,873,040 | B2 * | 3/2005 | Howard | H01L 23/49833 257/691 |
| 7,338,292 | B2 | 3/2008 | Johnson et al. | |
| 8,152,048 | B2 * | 4/2012 | Zu | H05K 3/3436 228/103 |
| 9,960,105 | B2 * | 5/2018 | Jiang | H01L 21/4853 |
| 11,282,773 | B2 * | 3/2022 | Tunga | H01L 21/50 |
| 2005/0133572 | A1 * | 6/2005 | Brese | H05K 3/3485 228/180.22 |
| 2006/0249303 | A1 | 11/2006 | Johnson et al. | |
| 2006/0263929 | A1 | 11/2006 | Matsunami | |
| 2007/0007322 | A1 | 1/2007 | Lee et al. | |
| 2010/0143656 | A1 | 6/2010 | Zu | |
| 2013/0269183 | A1 | 10/2013 | Vesce et al. | |
| 2014/0376202 | A1 | 12/2014 | Shibutani | |

FOREIGN PATENT DOCUMENTS

| | | |
|---|---|---|
| CN | 203884095 U | 10/2014 |
| CN | 107509319 A | 12/2017 |
| DE | 19816794 A1 | 10/1999 |
| DE | 10043471 A1 | 3/2002 |
| DE | 10138042 A1 | 11/2002 |
| DE | 10 2012 112 546 A1 | 6/2014 |
| DE | 102014208100 A1 | 10/2015 |
| EP | 0248566 A2 | 5/1987 |
| JP | 047849 A | 1/1992 |
| JP | 08316629 A | 11/1996 |
| WO | 9925163 A1 | 5/1999 |
| WO | 2005079125 A1 | 8/2005 |

OTHER PUBLICATIONS

International Search Report and Written Opinion for International Application No. PCT/EP2019/074014, mailed Dec. 16, 2019, with partial English translation, 10 pages.
International Search Report and Written Opinion for International Application No. PCT/EP2019/074014, mailed Dec. 16, 2019, 16 pages (German).
Office Action (The First Office Action) issued Oct. 31, 2023, by the State Intellectual Property Office of People's Republic of China in corresponding Chinese Patent Application No. 201980059480.X and an English translation of the Office Action. (12 pages).
Office Action (The Second Office Action) issued Jul. 31, 2024, by the State Intellectual Property Office of People's Republic of China in corresponding Chinese Patent Application No. 201980059480.X and an English translation of the Office Action. (17 pages).
Office Action (Communication pursuant to Article 94(3) EPC) issued Nov. 27, 2024, by the European Patent Office in corresponding European Patent Application No. 19 768 755.1-1211 and an English machine translation of the Office Action. (12 pages).
Office Action (Rejection Decision) issued Dec. 17, 2024, by the State Intellectual Property Office of People's Republic of China in corresponding Chinese Patent Application No. 201980059480.X and an English machine translation of the Office Action. (16 pages).

* cited by examiner

FIG 1

PRIOR ART

METHOD FOR PRODUCING A CIRCUIT BOARD ARRANGEMENT

CROSS REFERENCE TO RELATED APPLICATIONS

This application is the U.S. National Phase Application of PCT International Application No. PCT/EP2019/074014, filed Sep. 10, 2019, which claims priority to German Patent Application No. 10 2018 215 672.7, filed Sep. 14, 2018, the contents of such applications being incorporated by reference herein.

FIELD OF THE INVENTION

The invention relates to a method for producing a circuit board arrangement. The invention also relates to a circuit board arrangement.

BACKGROUND OF THE INVENTION

Nowadays, solder balls are used for the electrically conductive connection of two circuit boards. This allows more solder paste to be used per connection than is typically the case with simple solder paste connections. To arrange the solder balls, so-called ball grid arrays (BAG) have been developed, which use rows and columns of discretely spaced solder balls to establish the necessary electrical connections by melting the solder paste.

There are various methods for placing and then melting it to create a conductive connection. There is for example so-called laser jetting, in which the solder balls are placed one after the other in each connection provided for this purpose and then pressure-contacted. Furthermore, the solder balls can be arranged on the terminal contacts by a positioning system (pick and place system) and connected by means of SMD technology (surface mounting technology, SMT). Another possibility for application and method of connection is provided by the electroplating of a copper layer, subsequent etching by photolithography, and subsequent heating. However, these processes result in an awkward, unreliable, and expensive connecting solution.

US 20060249303 A1, incorporated herein by reference, discloses a connectionless connection from board to board, from cable to board or from cable to cable. The connection has solder balls or semi-ellipsoidal surface structures for the connection.

DE 10138042 A1, incorporated herein by reference, discloses a method for producing an electronic component which has at least one semiconductor chip and a redistribution board, on the first side of which the semiconductor chip is mounted, with conductor track structures and terminal contacts for electrical contacting of the electronic component to a circuit board being provided on a second side of the redistribution board facing away from the semiconductor chip, with the steps of: providing a redistribution board with conductor tracks and terminal contacts applied to its second side, mounting a semiconductor chip on the first side of the redistribution board without conductor track structures and establishing electrical connections between contact terminals of the semiconductor chip and the conductor tracks of the redistribution board, applying a closed solder resist layer on the second side of the redistribution board, structuring the solder resist layer, wherein the terminal contacts are at least partially exposed and wherein an inner lateral surface, widening in an outwardly beveled and/or stepped manner, of an opening in the solder resist layer surrounding each terminal contact is formed, respectively applying a solder ball to each exposed terminal contact, wherein the solder balls have in each case a slight clearance with respect to the edge of the opening in the solder resist layer, establishing a flip-chip connection between the electronic component and a circuit board by placing the electronic component with its solder balls on contact areas of the circuit board and melting the solder balls.

SUMMARY OF THE INVENTION

An aspect of the invention is based specifying an inexpensive and simple solution to the abovementioned problem.

An aspect of the invention is a method for producing a circuit board arrangement with the steps of:
  providing a first circuit board substrate,
  providing a second circuit board substrate, which is arranged substantially planar-parallel to the first circuit board substrate, the first circuit board substrate having an underside and the second circuit board substrate having an upper face, the upper face and the underside being arranged opposite one another,
  providing first terminal contacts, which are applied to the underside of the first circuit board substrate,
  providing second terminal contacts, which are applied to the upper face of the second circuit board substrate,
  applying solder paste cylinders to the first terminal contacts, the solder paste cylinders being applied to the first terminal contacts by a solder-paste application process with solder paste, the applied solder paste cylinders having in each case a solder-paste-cylinder upper face, and
  arranging the second terminal contacts of the second circuit board substrate on the solder-paste-cylinder upper faces of the solder paste cylinders.

A circuit board substrate should usually be understood as meaning a printed circuit board (PCB) or a substrate intended for forming a circuit board.

Solder paste cylinders should be understood as meaning columns/cylinders, substantially of a cylindrical form, of solder paste (soldering paste). It should be noted that the term cylinder should be understood as only in the sense of the basic form, with minor and major deviations, and not an exact mathematical description.

It has been recognized that a connection made by solder balls can be destroyed if a distortion or warpage caused by thermal expansion during subsequent melting occurs in the two circuit board substrates in that, during the melting, one or more solder balls are only in contact with one of the two circuit board substrates.

An aspect of the invention has the effect that detachment of the connection between the circuit board substrates is avoided. The solder paste cylinders expand flexibly when the two circuit board substrates bow (out), for example due to melting, so that almost all connections are maintained during a heating process. Due to the cylindrical form made of solder paste, detachment of the connection between the circuit board substrates can be avoided when there is a high degree of distortion and great bowing, for example up to 2.5 times the original distance between the two circuit board substrates. Even in the event of a distortion in which the distance between the two circuit board substrates is smaller than the original distance between the two circuit board substrates, the connection is maintained in that the solder paste cylinders can be flexibly compressed or pressed together. Bursting, as can be the case for example with metallic solder balls, can be avoided.

As a result of the invention, almost all connections that are formed by the solder paste cylinders can therefore be maintained during heating and subsequent cooling.

The laborious placement of solder balls can also be dispensed with, which leads to lower production costs.

In addition, the production of the circuit board substrates according to an aspect of the invention does not require any fastening or alignment elements, which results in lower production costs.

The solder paste cylinders according to an aspect of the invention allow a flexible arrangement on the circuit board substrates. In this way, HDI circuit boards (High-Density Interconnect circuit board) can be formed with a high contact or connection density, in particular circuit boards with more than 500 connections or pins per square decimeter.

The method preferably comprises the further step of: melting the solder paste cylinders to form a mechanical and electrically conductive connection between the first terminal contacts of the first circuit board substrate and the second terminal contacts of the second circuit board substrate. This creates a reliable contact between the two circuit board substrates. As a result of the melting, a connection between the first and second terminal contacts that is particularly easy to establish is possible.

In a further preferred embodiment, the melting is accomplished by a reflow process or a wave soldering process. Reflow soldering is a technology in which a solder paste that has already been applied to the component to be soldered is liquefied again by heating, thereby creating the desired contacts. With the known reflow soldering processes, the solder paste is usually printed onto the circuit boards or components to be soldered. The reflow process is mainly used for SMD components (surface-mount device, surface-mounted component).

In the wave soldering process, already liquefied solder is fed to the soldering point, whereby the melting is achieved.

Preferably, at least one distortion point occurs during melting due to thermal expansion of the first circuit board substrate and/or the second circuit board substrate, so that the solder paste cylinders form a peanut-shaped form and/or a squat columnar form at the at least one distortion point. The mechanical and electrical connection is maintained due to the flexible expansion of the solder paste cylinders.

Furthermore, the solder paste cylinders are preferably applied to the first terminal contacts by a solder-paste printing process. This allows the solder paste cylinders to be easily applied.

When applying the solder paste cylinders by the solder-paste application process, at least one surface-mountable terminal area made of solder paste, in particular for fastening SMD components, is preferably simultaneously applied to a terminal pad provided for this purpose, arranged on the underside.

This allows connections to be applied both for the circuit board arrangement in the form of the solder paste cylinders and for SMD components in one working step. Consequently, no additional working step is necessary for the simultaneous application and simultaneous melting of the solder paste cylinders and the terminal areas for SMD components. This saves both production time and costs.

In a further preferred embodiment, the solder paste cylinders are formed on the first terminal contacts by at least one first passage channel in a printing stencil and a terminal area is formed by at least one second passage channel in the printing stencil, the printing stencil having a stepped height profile with a first height and at least a second height, so that the first passage channel has the first height and the second passage channel has the second height. As a result, the solder paste cylinders and terminal areas can be applied particularly easily in one working step.

Another aspect of the invention is a circuit board arrangement comprising
- a first circuit board substrate,
- a second circuit board substrate, which is arranged substantially planar-parallel to the first circuit board substrate, the first circuit board substrate having an underside and the second circuit board substrate having an upper face, the upper face and the underside being arranged opposite one another,
- first terminal contacts, which are applied to the underside of the first circuit board substrate, and second terminal contacts, which are applied to the upper face of the second circuit board substrate,
- solder paste cylinders, which are arranged between the first terminal contacts of the first circuit board substrate and the corresponding second terminal contacts of the second circuit board substrate to form a mechanical and electrically conductive connection between the first terminal contacts of the first circuit board substrate and the second terminal contacts of the second circuit board substrate, the solder paste cylinders being applied to the first terminal contacts by a solder-paste application process with solder paste.

The circuit board arrangement according to an aspect of the invention has the effect that almost all connections that are formed by the solder paste cylinders are maintained during heating and subsequent cooling. The advantages of the method can also be transferred to the circuit board arrangement.

In a further preferred embodiment, the solder-paste application process is a solder-paste printing process. This allows the solder paste to be applied particularly easily.

The solder paste cylinders preferably have a height extending between the first terminal contacts of the first circuit board substrate and the second terminal contacts of the second circuit board substrate, the height having a value in the range from 350 µm to 700 µm. This height is particularly well suited for producing a circuit board arrangement which can be used in a vehicle.

The connection is particularly preferably a soldered connection.

In particular, the mechanical and electrically conductive connection between the first terminal contacts of the first circuit board substrate and the second terminal contacts of the second circuit board substrate is preferably accomplished by melting the solder paste cylinders. In this way, a connection that is particularly easy to establish can be achieved.

Since the first circuit board substrate and/or the second circuit board substrate have at least one distortion point due to the melting, it is advantageous if the solder paste cylinders have a peanut-shaped form and/or a squat columnar form at the at least one distortion point. Advantageously, in the event of a distortion in which the first circuit board substrate is at a greater distance from the second circuit board substrate in comparison with the original distance, the solder paste cylinders have a peanut-shaped form, and/or, in the event of a distortion in which the first circuit board substrate is at a smaller distance from the second circuit board substrate in comparison with the original distance, the solder paste cylinders have a squat columnar form. In this way it is possible to compensate well for the distortion without breaking the connections thereby created.

In a preferred embodiment, the first terminal contacts and the solder paste cylinders applied to them are arranged in a ring on the underside. A ring-shaped pattern allows thermally caused distortion/warpages during melting to be reduced.

The first terminal contacts and the solder paste cylinders preferably form a plurality of annular circumferential lines, the solder paste cylinders of the individual annular circumferential lines being equidistant from one another. In addition, the individual annular circumferential lines are also equidistant from one another. In this way, thermally caused individual hot spots can be avoided.

In particular, the first circuit board substrate preferably has at least one SMD component arranged on the underside and the second circuit board substrate preferably has a recess, the at least one SMD component protruding at least partially into the recess. This can save space.

According to an advantageous development, the first circuit board substrate is significantly larger than the second circuit board substrate. The first circuit board substrate can thus serve as a main circuit board, while the second circuit board substrate serves as a circuit module carrier.

Such a circuit board arrangement is particularly well suited for use in an electronic instrument cluster or some other motor vehicle/control/display device, such as for example a radio, etc.

The circuit board arrangement is particularly preferably produced by the method as described above.

BRIEF DESCRIPTION OF THE DRAWINGS

Further features, properties and advantages of aspects of the present invention emerge from the following description with reference to the attached figures, in which, schematically.

DETAILED DESCRIPTION OF THE PREFERRED EMBODIMENTS

Although an aspect of the invention has been more specifically illustrated and described in detail by the preferred exemplary embodiment, the invention is not restricted by the disclosed examples. Variations thereof may be derived by a person skilled in the art without departing from the scope of protection of the invention as is defined by the following patent claims.

Figure 1:
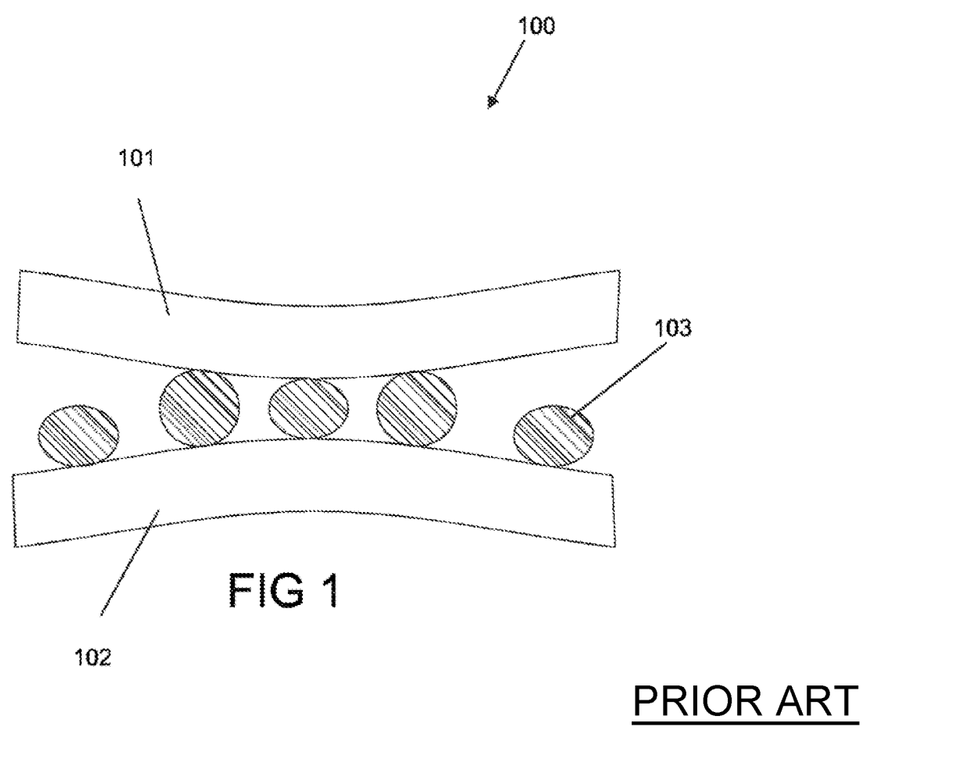
FIG. 1: shows a circuit board assembly according to the prior art.

FIG. 1 shows a circuit board assembly 100 in the case of the reflow process according to the prior art. The circuit board assembly 100 comprises a first circuit board 101 and a second circuit board 102 as well as solder balls 103 arranged between them for the mechanical and electrically conductive connection. The solder balls 103 are in this case preformed metal balls. During the reflow process, the thermal expansion of the circuit boards 101, 102 results in a distortion or warpage of the circuit boards 101, 102, which results here in an oppositely directed bowing of the two circuit boards 101 and 102. Due to the oppositely directed bowing of the two circuit boards 101, 102 and the accompanying distance between the two circuit boards 101, 102, the solder balls 103 sticking to one of the two circuit boards 101, 102 has the effect that the solder balls 103 come apart. This means that some of the connections are broken. The solder balls 103 in this case solidify before they make contact again with the two circuit boards 101, 102.

If the distance between the two circuit boards 101, 102 during the reflow process is too small, there is the risk that the metal balls preformed as solder balls 103 will "explode" if the two circuit boards 101, 102 are a smaller distance apart than a solder ball diameter due to thermally caused distortion.

Figure 2:
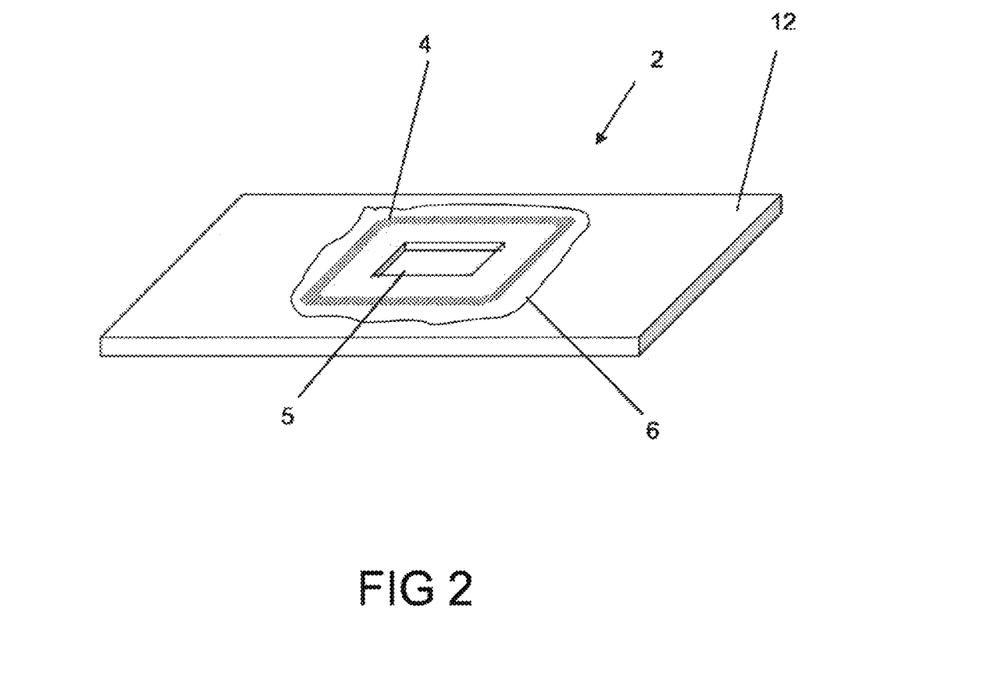
FIG. 2: schematically shows a second circuit board substrate according to an aspect of the invention.

FIG. 2 shows a second circuit board substrate 2 for forming a circuit board arrangement 3 (FIG. 3) according to an aspect of the invention. The second circuit board substrate 2 has an upper face 12 and second terminal contacts 4 arranged on it, as well as a recess 5. The second terminal contacts 4 are in this case arranged on the upper face 12 in the form of a ring in an edge region 6 or periphery of the recess 5. In the form of a ring also includes here a square that is rounded or beveled at the corners. A terminal contact 4 preferably has a circular area with a diameter of 450 µm.

Figure 3:
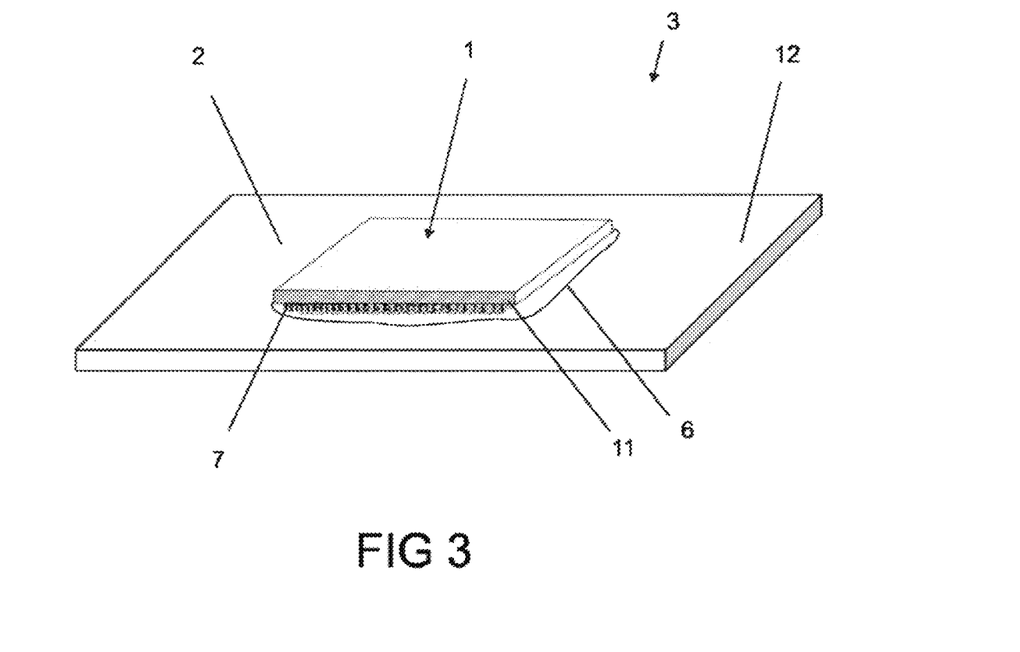
FIG. 3: schematically shows a circuit board arrangement according to an aspect of the invention.

FIG. 3 shows a circuit board arrangement 3 according to an aspect of the invention. The circuit board arrangement 3 has a first circuit board substrate 1 with an underside 11 and the second circuit board substrate 2 with the upper face 12. The first circuit board substrate 1 likewise has first terminal contacts 14 (FIG. 4), which are arranged on the underside 11. The first terminal contacts 14 and second terminal contacts 4 (FIG. 2) are arranged in a manner corresponding to one another on the underside 11 of the first circuit board substrate 1 and the upper face 12 of the second circuit board substrate 2. The circuit board arrangement 3 has solder paste cylinders 7 for forming a mechanical and electrically conductive soldered connection between the terminal contacts 14 (FIG. 4) of the first circuit board substrate 1 and the second terminal contacts 4 (FIG. 2) of the second circuit board substrate 2. The soldered connection is established by melting the solder paste cylinders 7. The first circuit board substrate 1 may for example be formed as a printed circuit board (PCB).

The solder paste cylinders 7 are applied to the first terminal contacts 14 (FIG. 4) by means of a solder-paste printing process. At the same time as the solder paste cylinders 7 are applied, terminal areas 10 (FIG. 4) for connecting other SMD components to corresponding terminal pads (not shown) of the first circuit board substrate 1 and/or other terminals may also be applied.

SMD components do not need any PCB holes for their mounting, but are soldered with their terminals directly to terminal pads provided for this purpose on the circuit board substrate. SMD components are then placed on the terminal pads provided with solder paste, for example by automatic placement machines, and soldered together with the solder paste cylinders 7 in a single reflow process.

Due to the simultaneous application of the solder paste cylinders 7 to form a mechanical and electrically conductive connection between the first terminal contacts 14 (FIG. 4) and second terminal contacts 4 (FIG. 2), and thus between the first circuit board substrate 1 and the second circuit board substrate 2, as well as the terminal area 10 (FIG. 4) in one and the same working step, production costs can be reduced by up to 50%. Faster production can be achieved. The connection by means of solder paste cylinders 7 also does not require any separate fastening or alignment elements, for example adhesive. This can also save costs.

The solder paste cylinders 7 have a cylindrical columnar form before melting, for example in a reflow process. A solder paste cylinder 7 before melting is shown in FIG. 4.

Solder paste or soldering paste is usually a paste-like mixture of solder metal powder and flux. There are solder pastes for hard soldering based on copper/zinc and silver and for resistance soldering. Solder paste suitable for SMD soldering consists for example of approx. 90% tin alloy balls and approx. 10 percent flux. The percentages relate here to mass percentages. The solder pastes which can be used in an aspect of the present invention preferably comprise paste-like printing compounds of any chemical composition, which can preferably be used for creating electrically conductive contacts. However, other suitable solder pastes can also be used.

The SMD components can in this case be arranged on the underside 11 of the circuit board substrate 1 in such a way that they protrude at least partially into the recess 5 (FIG. 2) when the circuit board substrate 1 is arranged on the second circuit board substrate 2.

Figure 4:
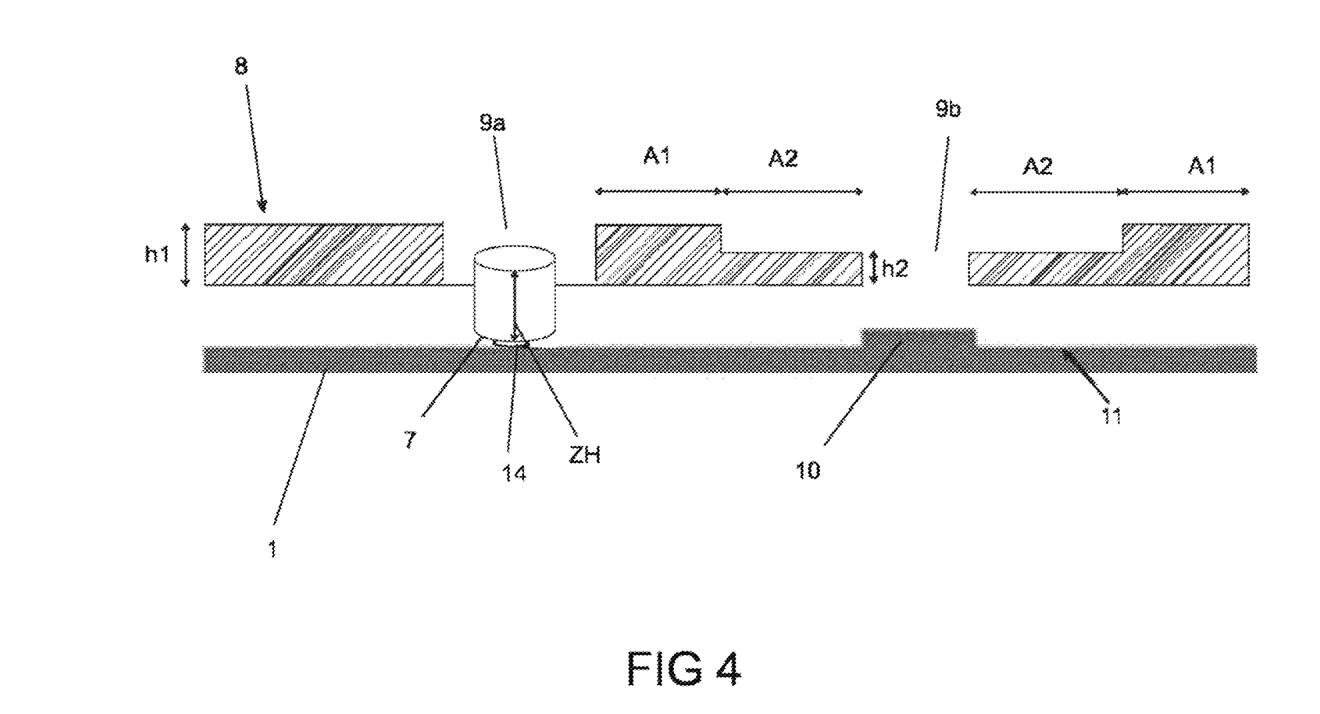
FIG. 4: shows a printing stencil and a first circuit board substrate according to an aspect of the invention.

The solder paste is applied through a printing stencil 8, as shown in FIG. 4. The solder paste is applied to the first terminal contacts 14 of the first circuit board substrate 1 by means of stencil printing to form a mechanical and electrically conductive connection between the first terminal contacts 14 of the first circuit board substrate 1 and the second terminal contacts 4 (FIG. 2) of the second circuit board substrate 2, as well as to the terminal pads (not shown) preferably to form an electrically conductive and mechanical contact between the SMD components and the circuits applied to the circuit board substrate 1.

The printing stencil 8 has passage channels 9a, 9b. Furthermore, the printing stencil 8 has a stepped height profile with at least two different heights h1 and h2, h1 being higher than h2. This results in at least a first passage channel 9a with a first height h1 and a second passage channel 9b of a second height h2, the first height h1 having a greater value than the second height h2.

The solder paste is applied to the circuit board substrate 1 with the aid of the printing stencil 8 to form a terminal area 10 for SMD components and to the terminal contacts 14 to form solder paste cylinders 7. By means of the two passage channels 9a, 9b of different heights and widths, terminals with different geometries, that is to say widths and heights, such as the terminal area 10 for SMD components or the solder paste cylinders 7, can thus be printed. In this exemplary embodiment, the solder paste cylinders 7 are printed with the aid of the passage channels 9a, which have the height h1. The passage channels 9a must in this case be positioned such that they are centered over the terminal contacts 14. The same applies analogously to the terminal areas 10.

The SMD components are then positioned on the terminal area 10 and the second terminal contacts 4 (FIG. 2) together with the second circuit board substrate 2 are positioned on the solder-paste-cylinder upper faces of the solder paste cylinders 7. The use of solder paste cylinders 7 and terminal areas 10 made of solder paste has the advantage that the solder paste is sticky, and so the SMD components as well as the second circuit board substrate 2 with the second terminal contacts 4 (FIG. 2) adhere directly to the solder paste cylinders 7. This makes it possible for example to dispense with separate adhesive bonding. The circuit board arrangement 3 produced in this way is then passed through a so-called reflow oven, in which the flux is activated by the heat effect and finally evaporates. The solder paste cylinders 7 melt and become connected to the first terminal contacts 14 and second terminal contacts 4 (FIG. 2) of the respective circuit board substrate 1, 2. The same applies analogously to the terminal areas 10 and the SMD components placed on them. The mechanical and electrically conductive connection is formed, also referred to as a soldered connection or solder connection.

Alternatively, the solder paste cylinders 7 may also be printed onto the second terminal contacts 4 (FIG. 2) of the second circuit board substrate 2. The procedure can then be continued in a way analogous to that described above.

The printing stencil 8 has in this exemplary embodiment a first height h1 of approximately 300 μm for the first passage channel 9a, a second height h2 of approximately 150 μm for the second passage channel 9b. The passage channels 9a, 9b have a total distance from one another that is made up of the distances A1 and A2. In this case, the first distance A1 has an extent of greater than 5.85 μm and the second distance A2 has an extent of greater than or equal to 0.65 μm. Depending on the height of the solder paste cylinders 7, the height may however also be chosen differently. For instance, the solder paste cylinders 7 may also have a height of 700 μm.

A known solder-paste application process is screen or stencil printing. The stencil/screen printing process allows high-precision application of solder paste to circuit boards.

FIG. 4 also shows a solder paste cylinder 7 in the printed state, before melting. It has a cylinder height ZH with a value of approximately ZH=450 μm. The solder paste cylinder 7 preferably has a value between 300 and 700 μm. The solder paste cylinder 7 has substantially a cylindrical form. In addition, FIG. 4 also shows a terminal area 10 for connection for SMD components.

The electrically conductive connection established by the solder paste cylinders 7 allows the circuit board substrate 1, 2 to be formed as HDI circuit boards (High-Density Interconnect circuit board) with high contact or connection density, in particular a circuit board with more than 500 connections or pins per square decimeter.

Figure 5:
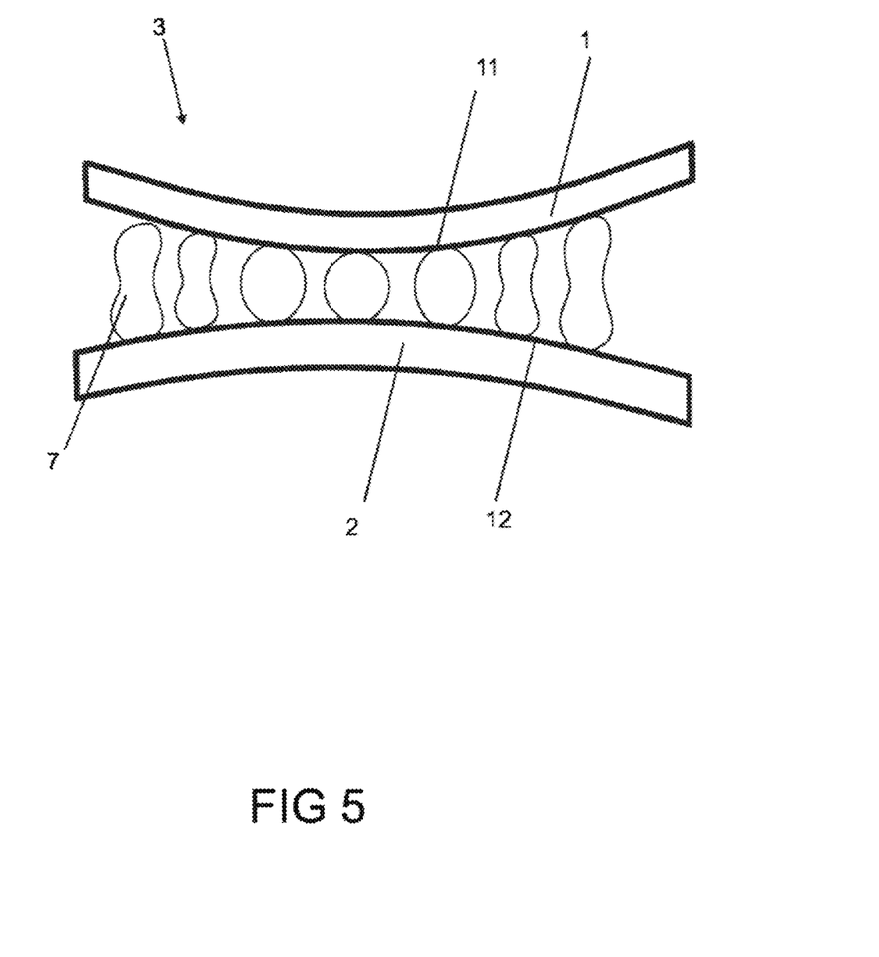
FIG. 5: shows a circuit board arrangement with solder paste cylinders in the reflow process according to an aspect of the invention.

FIG. 5 shows a circuit board arrangement 3 in the reflow process, with the first circuit board substrate 1 and the second circuit board substrate 2. The two circuit board substrates 1, 2 have in each case an oppositely directed bowing (out) caused by the thermal expansion in the reflow process. The use of solder paste cylinders 7 can compensate for this bowing. If the bowing creates a distance between the circuit board substrates 1, 2 that is greater than the previous distance, the solder paste cylinders 7 can expand at the same time, and for example assume the form of a peanut. Furthermore, if the distance between the two circuit board substrates 1, 2 produced by the bowing is smaller than the original distance before the reflow process, the solder paste cylinders 7 can be pressed together, and for example assume the form of a squashed column.

On the one hand, there is no detachment of the solder paste cylinders 7 from the first terminal contacts 14 (FIG. 4) and/or second terminal contacts 4 (FIG. 2) due to a distortion of the height caused by thermal expansion, that is to say when the original distance between the two circuit board substrates 1, 2 due to the bowing is then greater than the distance between the circuit board substrates 1, 2 before the reflow process. As a result, the solder paste cylinders 7 remain continuously in contact with both the first terminal contacts 14 of the first circuit board substrate 1 and the second terminals of the second circuit board substrate 2 during the reflow process and then form the electrically conductive connection.

Furthermore, there is no "bursting" of the solder paste cylinders 7, as is the case for example with the solder balls, if the original distance between the two circuit board substrates 1, 2 due to the bowing is then significantly less than the distance between the circuit board substrates 1, 2 before the reflow process, since the solder paste cylinders 7 allow themselves to be pressed together into a squashed columnar form.

A detachment or bursting of the connections as in the prior art can thus be avoided. Forming the connections with solder paste cylinders 7 makes it possible to compensate for a height of the distortion that occurs due to thermal expansion during the melting process of up to 2.5 times the original height of the distance between the circuit board substrates 1, 2.

The circuit board arrangement 3 produced in this way can accordingly have melted solder paste cylinders 7, some of which have a squashed columnar form or a peanut form.

Any suitable melting process may be used here instead of the reflow process.

Figure 6:
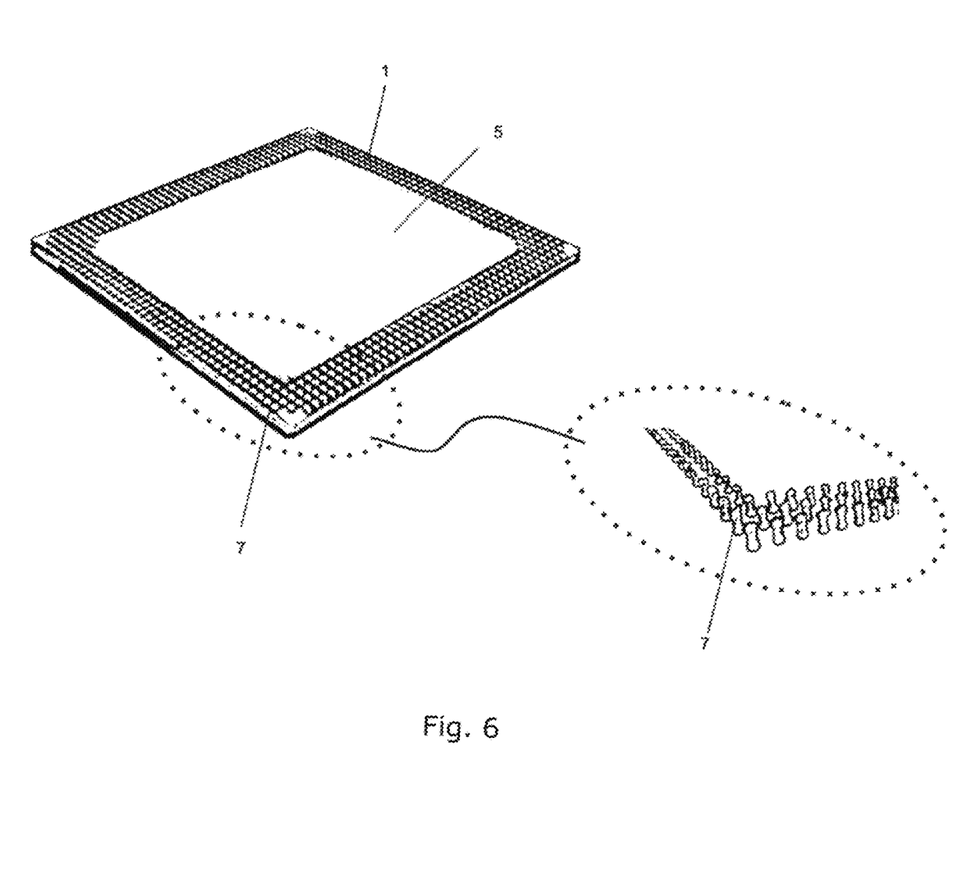
FIG. 6: shows an arrangement of the solder paste cylinders on the first circuit board substrate according to an aspect of the invention.

FIG. 6 shows an arrangement of the solder paste cylinders 7 on the first circuit board substrate 1. These can be arranged substantially in the form of a ring on the first circuit board substrate 1, where in the form of a ring should also be understood as meaning a rounded square. This arrangement in the form of a ring allows warpages/distortion during the melting process to be reduced. Furthermore, a more flexible distribution of the solder paste cylinders 7 can be achieved, and a better weight balance can also be achieved. Furthermore, FIG. 6 shows a detail of solder paste cylinders 7 after the reflow process. These have a "peanut" form due to distortion.

LIST OF REFERENCE SIGNS

100 Circuit board assembly (prior art)
101 First circuit board (prior art)
102 Second circuit board (prior art)
103 Solder balls (prior art)
1 First circuit board substrate
2 Second circuit board substrate
3 Circuit board arrangement
4 Second terminal contacts
5 Recess
6 Periphery
7 Solder paste cylinders
8 Printing stencil
9*a*,9*b* Passage channels
10 Terminal area
11 Underside
12 Upper face
14 First terminal contacts
A1,A2 Distance
H1,H2,ZH Height

The invention claimed is:

1. A method for producing a circuit board arrangement, comprising:
   providing a first circuit board substrate,
   providing a second circuit board substrate, which is arranged substantially planar-parallel to the first circuit board substrate, the first circuit board substrate having an underside and the second circuit board substrate having an upper face, the upper face and the underside being arranged opposite one another,
   providing first terminal contacts, which are applied to the underside of the first circuit board substrate,
   providing second terminal contacts, which are applied to the upper face of the second circuit board substrate,
   applying solder paste cylinders to the first terminal contacts, the solder paste cylinders being applied directly to the first terminal contacts by a solder-paste application process with solder paste, the applied solder paste cylinders having in each case a solder-paste-cylinder upper face,
   arranging the second terminal contacts of the second circuit board substrate directly on the solder-paste-cylinder upper faces of the solder paste cylinders, and
   when applying the solder paste cylinders by the solder-paste application process, simultaneously applying at least one surface-mountable terminal area made of solder paste for fastening Surface Mount Device (SMD) components to a terminal pad arranged on the underside of the first circuit board substrate.

2. The method for producing a circuit board arrangement as claimed in claim 1, the method further comprising: melting the solder paste cylinders to form a mechanical and electrically conductive connection between the first terminal contacts of the first circuit board substrate and the second terminal contacts of the second circuit board substrate.

3. The method for producing a circuit board arrangement as claimed in claim 2, wherein the melting is accomplished by a reflow process or a wave soldering process.

4. The method for producing a circuit board arrangement as claimed in claim 3, wherein at least one distortion point occurs during melting due to thermal expansion of the first circuit board substrate and/or the second circuit board substrate, so that the solder paste cylinders form a peanut-shaped form and/or a squat columnar form at the at least one distortion point.

5. The method for producing a circuit board arrangement as claimed in claim 2, wherein at least one distortion point occurs during melting due to thermal expansion of the first circuit board substrate and/or the second circuit board substrate, so that the solder paste cylinders form a peanut-shaped form and/or a squat columnar form at the at least one distortion point.

6. The method for producing a circuit board arrangement as claimed in claim 1, wherein the solder paste cylinders are applied to the first terminal contacts by a solder-paste printing process.

7. The method for producing a circuit board arrangement as claimed in claim 1, wherein the solder paste cylinders are formed on the first terminal contacts by at least one first passage channel in a printing stencil and a terminal area is formed by at least one second passage channel in the printing stencil, the printing stencil having a stepped height profile with a first height and at least a second height, so that the first passage channel has the first height and the second passage channel has the second height.

8. The method for producing a circuit board arrangement as claimed in claim 1, the method further comprising: providing a recess on the second circuit board substrate and arranging at least one SMD component on the underside of the first circuit board substrate, wherein the at least one SMD component protrudes at least partially into the recess.

* * * * *